(12) United States Patent
Hirao et al.

(10) Patent No.: US 7,001,841 B2
(45) Date of Patent: Feb. 21, 2006

(54) PRODUCTION METHOD OF SEMICONDUCTOR DEVICE

(75) Inventors: Shuji Hirao, Osaka (JP); Takeshi Harada, Shiga (JP); Kazushi Nii, Osaka (JP); Takenobu Kishida, Osaka (JP); Atsushi Ikeda, Niigata (JP); Kazunori Tsuji, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/643,980

(22) Filed: Aug. 20, 2003

(65) Prior Publication Data

US 2004/0175936 A1 Sep. 9, 2004

(30) Foreign Application Priority Data

Aug. 26, 2002 (JP) .............................. 2002-245509

(51) Int. Cl.
*H01L 21/44* (2006.01)
(52) U.S. Cl. ..................... 438/660; 438/687; 438/643
(58) Field of Classification Search ................ 438/660, 438/687, 643, 648
See application file for complete search history.

(56) References Cited

U.S. PATENT DOCUMENTS

| 4,020,222 | A | * | 4/1977 | Kausche et al. ............ 428/209 |
| 5,420,072 | A | * | 5/1995 | Fiordalice et al. .......... 438/607 |
| 5,747,361 | A | * | 5/1998 | Ouellet ....................... 438/643 |
| 5,882,738 | A | * | 3/1999 | Blish et al. .................. 427/526 |
| 6,069,068 | A | * | 5/2000 | Rathore et al. ............. 438/628 |
| 6,221,765 | B1 | | 4/2001 | Ueno |
| 6,352,926 | B1 | * | 3/2002 | Ding et al. .................. 438/687 |
| 6,646,346 | B1 | * | 11/2003 | Snyder et al. .............. 257/750 |
| 2002/0190352 | A1 | * | 12/2002 | Kishida et al. ............. 257/630 |

FOREIGN PATENT DOCUMENTS

| JP | 11-283979 | | 10/1999 |
| WO | WO 99/33110 | * | 7/1999 |

* cited by examiner

*Primary Examiner*—Caridad Everhart
(74) *Attorney, Agent, or Firm*—McDermott Will & Emery LLP

(57) ABSTRACT

After a thin first conductive film is formed on a barrier film having a crystal structure, a second conductive film is formed on the first conductive film. Thereafter, the first conductive film and the second conductive film are heated such that the first and second conductive films are integrated to form a third conductive film.

35 Claims, 6 Drawing Sheets

Thickness of seed Cu layer + Thickness of plated Cu film = 700nm [Constant]

Thickness of seed layer

Results of high temperature storage test (250°C) for via resistance

US 7,001,841 B2

PRODUCTION METHOD OF SEMICONDUCTOR DEVICE

BACKGROUND OF THE INVENTION

The present invention relates to a production method of a semiconductor device, and specifically to a production method of a semiconductor device having a high stress migration (SM) resistance.

Conventionally, aluminum has been mainly employed as a wring material for an LSI circuit formed on a semiconductor substrate of silicon. In recent years, on the other hand, copper has been receiving more attention as the wiring material along with an increase in the integration degree and an increase in the processing speed of semiconductor integrated circuits, because copper has a lower resistance and higher electromigration (EM) resistance as compared with aluminum. Moreover, as a method for forming a copper film, the electrolytic plating method has been employed because this method can readily and sufficiently fill a trench or hole with the copper film.

FIGS. 6A to 6D are cross-sectional views which illustrate a conventional production method of a semiconductor device. Specifically, these figures illustrate respective steps of a conventional method for forming copper wires.

In the first place, as shown in FIG. 6A, a first insulating film 2 including first copper wires 3 buried therein is formed on a semiconductor substrate 1 having a semiconductor element (not shown) formed thereon. Then, a second insulating film 4 is formed on the first insulating film 2. Thereafter, in the second insulating film 4, holes 5 are formed so as to reach the first copper wires 3, and wire trenches 6 are formed so as to communicate with the holes 5.

Next, as shown in FIG. 6B, a barrier film 7 of tantalum (Ta) having a thickness of about 30 nm and a seed layer 8 of copper (Cu) having a thickness of about 150 nm are sequentially formed by sputtering over the entire surface of the second insulating film 4 which includes the bottom and walls of the holes 5 and the wire trenches 6.

Next, as shown in FIG. 6C, a copper film 9 is deposited by an electrolytic plating method so as to completely fill the holes 5 and the wire trenches 6. Thereafter, for the purpose of stabilizing the copper film 9, the copper film 9 is annealed at 200° C. for about 60 minutes. As a result, the seed layer 8 and the copper film 9 are integrated (hereinafter, a resultant film formed by integrating the seed layer 8 and the copper film 9 is simply referred to as "copper film 9").

Next, parts of the copper film 9 and barrier film 7 which extend out of the wire trenches 6 are removed using a chemical-mechanical polishing (CMP) method. As a result, second copper wires 9A are formed on the barrier film 7 in the holes 5 and the wire trenches 6 as shown in FIG. 6D.

In the conventional copper wire formation method illustrated in FIGS. 6A to 6D, some problems occur due to stress migration (SM).

The present inventors studied the problems and found the causes thereof. Specifically, we found that at the steps subsequent to the formation of copper wires, for example, at the step of depositing a silicon nitride film or interlayer dielectric on the copper wires or at the step of a sintering process, a wafer is heated so that the copper film is re-crystallized, and accordingly, voids are formed in the copper film. For example, in the case where after the formation of the second copper wires 9A at the step of FIG. 6D, a silicon nitride film 10 and a third insulating film (interlayer dielectric) 11 are sequentially formed on the second copper wires 9A, voids 12 are formed in the second copper wires 9A because of the above-described mechanism. As a result, the production yield of the semiconductor device decreases. Moreover, even after a semiconductor device is shipped as a final product, voids are formed in the copper wires due to heat generated during the operation of the semiconductor device, and as a result, the reliability of the semiconductor device decreases. One possible method for preventing the formation of voids at the steps subsequent to the copper plating and during the operation of the semiconductor device is to sufficiently anneal the copper film immediately after the copper film is plated. However, in the case where the copper film 9 is annealed at 300° C. for about 60 minutes after the holes 5 and the wire trenches 6 are filled with the copper film 9 using an electrolytic plating method at the step of FIG. 6C, a problem shown in FIG. 8 occurs. That is, voids 13 are formed in the portions of the copper film 9 which are provided inside the holes 5 and the wire trenches 6 because the annealing temperature is too high.

As described above, the conventional method involves a trade-off relationship. That is, if the temperature of annealing performed immediately after the copper plating is high, voids are formed at this annealing step. On the other hand, if the annealing temperature is low, voids are formed at a subsequent step or during the operation of the semiconductor device.

SUMMARY OF THE INVENTION

In view of the above, an objective of the present invention is to improve the wiring reliability and increase the production yield of a semiconductor device by preventing occurrence of a defect due to stress migration.

For the purpose of achieving the above objective, the first production method of a semiconductor device according to the present invention comprises the steps of: non-epitaxially growing a first conductive film on a barrier film having a crystal structure; forming a second conductive film on the first conductive film; and heating the first conductive film and the second conductive film such that the first and second conductive films are integrated to form a third conductive film.

According to the first production method of a semiconductor device, a first conductive film is non-epitaxially grown on a barrier film having a crystal structure, and therefore, the grain size is small and the energy state is high in both the first conductive film and a second conductive film formed thereon. Thus, each of the first conductive film and the second conductive film is readily crystallized with small activation energy, i.e., at a low temperature, such that no void is formed. Moreover, since the grain size of the first conductive film is small, crystallization of the first conductive film proceeds while establishing a lattice match with the crystal structure of the underlying barrier film. Accordingly, the adhesion between the barrier film and the first conductive film improves, and therefore, the first and second conductive films can be crystallized to form a third conductive film without forming a void. Even when heat is applied to the third conductive film at a subsequent step or during the operation of the semiconductor device, re-crystallization of the third conductive film is suppressed because the third conductive film has already been sufficiently crystallized. As a result, formation of voids in the third conductive film is prevented. That is, when the thus-formed third conductive film is employed as a wire, occurrence of a defect due to stress migration is prevented, whereby the wiring reliability is improved and the production yield of the semiconductor device is increased.

The second production method of a semiconductor device according to the present invention comprises the steps of: depositing a first conductive film on a barrier film having a crystal structure; forming a second conductive film on the first conductive film; and heating the first conductive film and the second conductive film such that the first and second conductive films are integrated to form a third conductive film, wherein the thickness of the first conductive film is set to be equal to or smaller than a ¼ of the total thickness of the first conductive film and the second conductive film.

According to the second production method of a semiconductor device, the thickness of the first conductive film (e.g., seed layer) formed on the barrier film having a crystal structure is a ¼ of the total thickness of the first conductive film and the second conductive film (e.g., plated film) formed thereon. With such an arrangement, in the heat process performed on the first conductive film and the second conductive film, the first and second conductive films are sufficiently crystallized to form the third conductive film without using a high temperature which may cause formation of voids. Moreover, even if heat is applied to the third conductive film at a subsequent step or during the operation of the semiconductor device, re-crystallization of the third conductive film is suppressed because the third conductive film has already been sufficiently crystallized. As a result, formation of voids in the third conductive film is prevented. That is, when the thus-formed third conductive film is employed as a wire, occurrence of a defect due to stress migration is prevented, whereby the wiring reliability is improved and the production yield of the semiconductor device is increased.

The third production method of a semiconductor device according to the present invention comprises the steps of: depositing a first conductive film on a barrier film having a crystal structure; forming a second conductive film on the first conductive film; and heating the first conductive film and the second conductive film such that the first and second conductive films are integrated to form a third conductive film, wherein the thickness of the first conductive film is set to be equal to or smaller than 120 nm.

According to the third production method of a semiconductor device, the thickness of the first conductive film (e.g., seed layer) formed on the barrier film having a crystal structure is equal to or smaller than 120 nm. Therefore, in the heat process performed on the first conductive film and the second conductive film (e.g., plated film) formed thereon, the first and second conductive films are sufficiently crystallized to form the third conductive film without using a high temperature which may cause formation of voids. Moreover, even if heat is applied to the third conductive film at a subsequent step or during the operation of the semiconductor device, re-crystallization of the third conductive film is suppressed because the third conductive film has already been sufficiently crystallized. As a result, formation of voids in the third conductive film is prevented. That is, when the thus-formed third conductive film is employed as a wire, occurrence of a defect due to stress migration is prevented, whereby the wiring reliability is improved and the production yield of the semiconductor device is increased.

In each of the first to third production methods, each of the first conductive film and the second conductive film is preferably formed of copper or a metal mainly containing copper.

With such a material, a low-resistant copper wiring having a high electromigration (EM) resistance can be formed.

In each of the first to third production methods, the resistivity of the third conductive film is preferably equal to or smaller than 1.9 $\mu\Omega\cdot cm$.

In each of the first to third production methods, the resistivity of a layered film including the first conductive film and the second conductive film before the integration of the first and second conductive films is preferably equal to or greater than 2.2 $\mu\Omega\cdot cm$.

In each of the first to third production methods, the step of growing (depositing) the first conductive film is preferably performed at a temperature which is equal to or lower than a ⅓ of the absolute temperature of the melting point of the first conductive film.

In each of the first to third production methods, the step of heating the first conductive film and the second conductive film is preferably performed at a temperature which is equal to or lower than a ½ of the absolute temperature of the melting point of the third conductive film.

In each of the first to third production methods, the barrier film may be a tantalum film or tantalum alloy film. In this case, when the crystal structure of the tantalum film or tantalum alloy film is a β-structure, the following effects are obtained. Specifically, when the first and second conductive films are formed of copper or an alloy mainly containing copper, the first and second conductive films are readily formed on the barrier film because the crystal structure of β-structured tantalum is similar to that of copper.

In each of the first to third production methods, the step of growing (depositing) the first conductive film may include the step of forming the first conductive film by a physical vapor deposition method or a chemical vapor deposition method.

In each of the first to third production methods, the step of forming the second conductive film may include the step of forming the second conductive film by a chemical vapor deposition method or a plating method.

In each of the first to third production methods, the step of heating the first conductive film and the second conductive film is preferably performed at a temperature equal to or lower than 200° C.

With such an arrangement, each of the first conductive film and the second conductive film is sufficiently crystallized without forming a void because low-temperature annealing is performed on the first and second conductive films.

In each of the first to third production methods, the barrier film is preferably formed on a wall of a concaved portion provided in an insulating film; the step of growing (depositing) the first conductive film preferably includes the step of forming the first conductive film on the barrier film in the concaved portion such that the concaved portion is filled to an intermediate depth thereof; the step of forming the second conductive film preferably includes the step of forming the second conductive film on the first conductive film in the concaved portion such that the concaved portion is completely filled; and preferably, the method further includes, after the step of heating the first conductive film and the second conductive film such that the first and second conductive films are integrated to form a third conductive film, the step of removing a portion of the third conductive film which extends out of the concaved portion, thereby forming a wire in the concaved portion.

With such an arrangement, a highly-reliable buried wire can surely be formed.

As described above, according to the present invention, a thin seed layer is deposited on a barrier film having a crystallinity, whereby a conductive film formed on the seed layer is sufficiently crystallized even if a heat process is performed on the conductive film at a low temperature such that a void is not formed. Moreover, even if heat is applied to the conductive film at a subsequent step or during the operation of the semiconductor device, re-crystallization of the conductive film is suppressed because the conductive film has already been sufficiently crystallized. As a result, formation of voids in the conductive film is prevented. That is, when the thus-formed third conductive film is employed as a wire, occurrence of a defect due to stress migration is prevented, whereby the wiring reliability is improved and the production yield of the semiconductor device is increased.

DESCRIPTION OF THE PREFERRED EMBODIMENTS (Basic Principle of the Present Invention)

The present invention is characterized in that a thin first conductive film (e.g., seed layer) is non-epitaxially grown on a barrier film having a crystal structure, and thereafter, a second conductive film (e.g., plated film) is deposited on the first conductive film.

First, non-epitaxial growth of a seed layer on a barrier film having a crystal structure is described. If a seed layer is non-epitaxially grown on a barrier film having a certain crystal structure, in other words, if a seed layer is deposited at a temperature lower than the epitaxial growth temperature so that the seed layer is in an incomplete crystal state instead of having an epitaxially-grown hard crystal structure, the seed layer on the barrier film does not have a sufficient crystallinity at the time when it is deposited. That is, the seed layer is deposited so as to have a relatively amorphous film state. Thereafter, a plated film is deposited on the seed layer.

Then, an annealing step is performed such that the seed layer and the plated film are integrated, and a conductive film formed by integrating the seed layer and the plated film is completely crystallized. Herein, each of the seed layer and the plated film is readily crystallized with a small activation energy, i.e., at a low temperature. This is because, in both the seed layer and the plated film formed thereon, the grain size is small, and thus, the energy state is high.

Moreover, at the above annealing step, the seed layer formed on the barrier film is crystallized so as to have a lattice match with the crystal structure of the barrier film, and the plated film formed on the seed layer is crystallized so as to have a lattice match with the crystal structure of the seed layer, because the barrier film already has a crystal structure before annealing. That is, by performing crystallization so as to establish a match with a neighboring crystal lattice, a stable crystal structure can be formed with a smaller crystallization energy. Accordingly, the adhesion between the barrier film and the seed layer is improved, and thus, both the seed layer and the plated film can be crystallized without forming a void. It should be noted that the barrier film is desirably made of a crystalline material which can readily establish a lattice match with the seed layer and the plated film.

Now, effects obtained by depositing a thin seed film on a barrier film having a crystal structure are described. Specifically, we examined the relationship between the thickness of a seed Cu layer and a decrease in the resistance of a plated Cu film due to annealing in order to elucidate the stress migration phenomenon. Results of our examination are described below.

Figure 1:
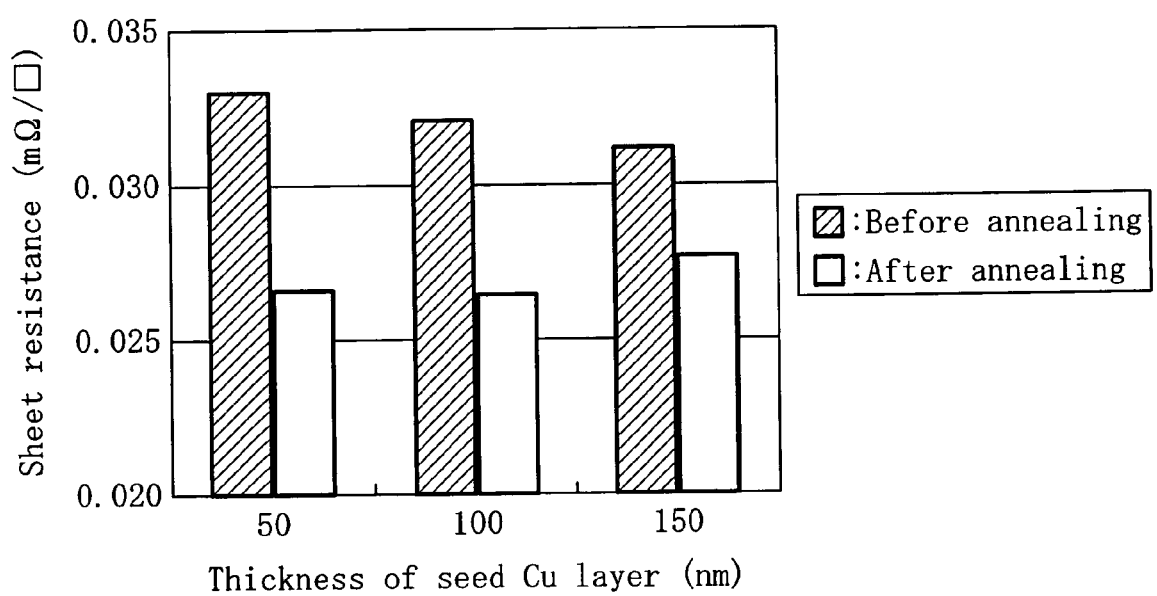
FIG. 1 shows the sheet resistance value of the plated Cu film before annealing and the sheet resistance value of the plated Cu film after annealing for each of the cases where the thickness of a seed Cu layer is 50 nm, 100 nm, and 150 nm.

FIG. 1 shows, for each of the cases where the thickness of the seed Cu layer is 50 nm, 100 nm, and 150 nm, the sheet resistance value of the plated Cu film (precisely, a layered film including a barrier film, a seed Cu layer, and a plated Cu film) which is measured before annealing and the sheet resistance value of the Cu film (precisely, a layered film including the barrier film and the Cu film formed by integrating the seed Cu layer and the plated Cu film) which is measured after annealing. It should be noted that the thickness of the plated Cu film is determined such that the total thickness of the seed Cu layer and the plated Cu film is always 700 nm.

As shown in FIG. 1, when the thickness of the seed Cu layer was 50 nm, the sheet resistance value of the plated Cu film before annealing was 0.0330 m$\Omega$/mm$^2$, and the sheet resistance value of the Cu film after annealing was 0.0266 m$\Omega$/mm$^2$. The resistivity of the Cu film was calculated based on the measured sheet resistance value. The resistivity of the plated Cu film before annealing resulted in a high value of 2.31 $\mu\Omega$·cm, whereas the resistivity of the Cu film after annealing resulted in a low value of 1.86 $\mu\Omega$·cm. It is seen that the resistivity value of the Cu film after annealing is much closer to the resistivity value of a Cu single crystal film, i.e., 1.7 $\mu\Omega$·cm, as compared with the resistivity value of the Cu film before annealing.

When the thickness of the seed Cu layer was 100 nm, the sheet resistance value of the plated Cu film before annealing was 0.0321 m$\Omega$/mm$^2$, and the sheet resistance value of the Cu film after annealing was 0.0265 m$\Omega$/mm$^2$. The resistivity of the Cu film was calculated based on the measured sheet resistance value. The resistivity of the plated Cu film before annealing resulted in a high value of 2.25 $\mu\Omega$·cm, whereas the resistivity of the Cu film after annealing resulted in a low value of 1.86 $\mu\Omega$·cm. Also in this case, it is seen that the resistivity value of the Cu film after annealing is much closer to the resistivity value of a Cu single crystal film, i.e., 1.7 $\mu\Omega\cdot$cm, as compared with the resistivity value of the Cu film before annealing.

However, when the thickness of the seed Cu layer was 150 nm, the sheet resistance value of the plated Cu film before annealing was 0.0321 m$\Omega$/mm$^2$, and the sheet resistance value of the Cu film after annealing was 0.0277 m$\Omega$/mm$^2$. The resistivity of the Cu film was calculated based on the measured sheet resistance value. The resistivity of the plated Cu film before annealing resulted in 2.18 $\mu\Omega\cdot$cm, which is relatively low as compared with a case where the thickness of the seed Cu layer was 50 nm or 100 nm. The resistivity of the Cu film after annealing resulted in 1.93 $\mu\Omega\cdot$cm, which is relatively high as compared with a case where the thickness of the seed Cu layer was 50 nm or 100 nm. Thus, it is seen that as for the seed Cu layer having a thickness of 150 nm, the difference between the resistivity value of the Cu film after annealing and the resistivity value of a Cu single crystal film of 1.7 $\mu\Omega\cdot$cm is relatively large.

Thus, it is seen that the thickness of the seed Cu layer is small to some extent, the resistance value of the Cu film after annealing is greatly decreased, i.e., crystallization of the Cu film after annealing proceeds so as to have a crystal state similar to that of a single crystal of Cu. On the other hand, when the thickness of the seed Cu layer is large, the resistivity of the Cu film after annealing is not sufficiently decreased and does not vary much from the resistivity of the plated Cu film before annealing. That is, it is found that the crystallization of the Cu film after annealing is not complete.

Herein, when the resistivity of a film is high, it means that the grain size of the film is small and electrons are scattered at the grain boundary. That is, a film having a smaller grain size has a higher energy state. Thus, neighboring crystal grains are readily combined only with some (i.e., not large) amount of activation energy, and accordingly, the grain size increases so that a resultant crystal structure is similar to that of a single crystal.

As described above, as the grain size before annealing becomes smaller, i.e., as the resistivity before annealing becomes higher, the grain size can be increased at a lower annealing temperature. As a result, it is possible to form a film having a low resistivity value which is close to that of a single crystal. Specifically, the resistivity of the Cu plated film before annealing is desirably equal to or greater than 2.2 $\mu\Omega\cdot$cm and equal to or smaller than 2.7 $\mu\Omega\cdot$cm. The resistivity of the Cu film after annealing is desirably equal to or greater than 1.7 $\mu\Omega\cdot$cm and equal to or smaller than 1.9 $\mu\Omega\cdot$cm.

Figure 2:
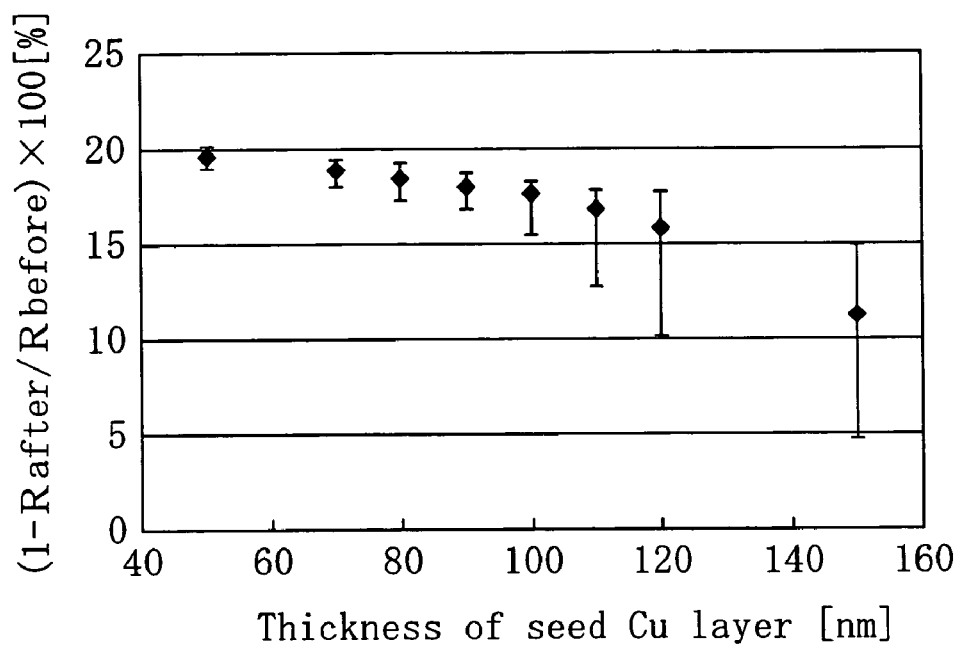
FIG. 2 shows a variation of the sheet resistance value of the plated Cu film between before and after annealing of the plated Cu film for various seed Cu layers having different thicknesses.

FIG. 2 shows a variation of the sheet resistance value of the plated Cu film between before and after the annealing of the plated Cu film at a relatively low temperature of 150° C. for 120 minutes for various seed Cu layers having different thicknesses. It should be noted that the thickness of the plated Cu film is determined such that the total thickness of the seed Cu layer and the plated Cu film is always 700 nm. In FIG. 2, the horizontal axis represents the thickness of the seed Cu layer, and the vertical axis represents the decrease rate of the resistance of the plated Cu film (=(1-R$_{after}$/R$_{before}$)×100[%]). The error bar represents the maximum and minimum values of the decrease rate of the resistance. Herein, R$_{before}$ is a sheet resistance value of the plated Cu film before annealing, and Rafter is a sheet resistance value of the Cu film after annealing. The resistance decrease rate shown in FIG. 2 is an average value of the resistance decrease rate measured at 225 positions over a surface of a wafer. As seen from the results shown in FIG. 2, as the thickness of the seed Cu layer increases, the resistance decrease rate decreases. When the thickness of the seed Cu layer is equal to or smaller than 120 nm, the resistance decrease rate is scarcely influenced by the thickness of the seed Cu layer and is stable at a relatively high level.

From the above results, it is seen that as the thickness of the seed Cu layer (first conductive film) decreases, the sheet resistance decrease rate of the Cu film after annealing (third conductive film) increases, and the resistivity of the Cu film after annealing decreases. Considering that the resistivity is in relation to the density of the grain boundary, the grain size of the Cu film after annealing (third conductive film) increases as the thickness of the seed Cu layer (first conductive film) decreases. It should be noted that the sheet resistance decrease rate of the Cu film after annealing is generally constant in the range where thickness of the seed Cu layer is 120 nm or smaller. On the other hand, when the thickness of the seed Cu layer is 150 nm, the sheet resistance decrease rate of the Cu film after annealing is small, and the resistivity of the Cu film after annealing is relatively high. This means that the crystal growth of the Cu film after annealing is not sufficient. In this case, it is estimated that, the crystal growth of the Cu film further proceeds due to heat generated during a heating process subsequent to plating or heat generated during the operation of the semiconductor device, and as a result, the volume of the Cu film shrinks. As a result, voids are formed in the Cu film after annealing.

Figure 3:
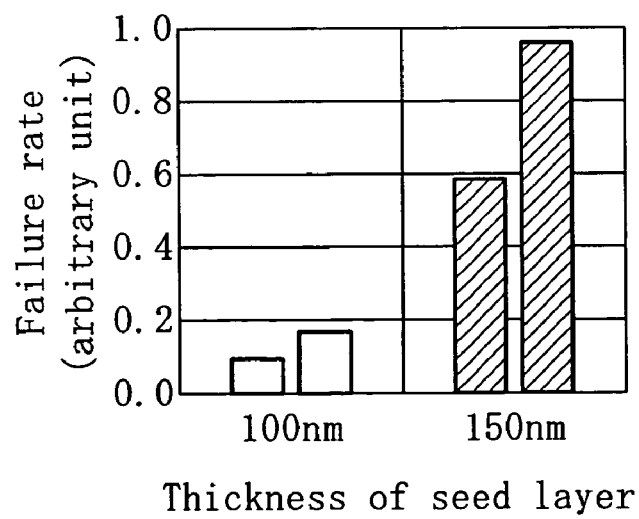
FIG. 3 shows results of the SM resistance test (high temperature storage test (250° C.) for the via resistance) performed on a via wiring made of a plated Cu film for each of the cases where the thickness of the seed Cu layer is 150 nm and 100 nm.

FIG. 3 shows results of the SM resistance test (high temperature storage test (250° C.) for the via resistance) performed on a via wiring made of a plated Cu film for each of the cases where the thickness of the seed Cu layer is 150 nm and 100 nm. It should be noted that the thickness of the plated Cu film is determined such that the total thickness of the seed Cu layer and the plated Cu film is always 500 nm. Further, in FIG. 3, for each of the cases where the thickness of the seed Cu layer is 150 nm and 100 nm, the result of the SM resistance test is represented by the failure rate (arbitrary unit: a.u.) separately obtained for each of two wafers.

Specifically, as shown in FIG. 3, when the thickness of the seed Cu layer is 150 nm, i.e., about a ⅓ of the total thickness of the plated Cu film and the seed Cu layer, the failure rate is as high as about 0.8 a.u. On the other hand, when the thickness of the seed Cu layer is 100 nm, i.e., about a ⅕ of the total thickness of the plated Cu film and the seed Cu layer, the failure rate is as low as about 0.1 a.u. That is, it is seen that the failure rate greatly decreases as the thickness of the seed Cu layer decreases.

It should be noted that the above-described effects obtained by decreasing the thickness of the seed layer are achieved regardless of the type of the materials of the barrier film, the first conductive film and the second conductive film, and the formation methods of the respective conductive films. The reason of the above is described below.

According to the present invention, a thin seed layer (first conductive film) is deposited on a barrier film having crystallinity, whereby the crystallinity of a second conductive film (e.g., plated film) formed on the first conductive film is decreased. In other words, the second conductive film is formed on the seed layer so as to have a more amorphous-like state. On the other hand, since the seed layer itself has some crystallinity, the crystallinity (orientation) of the seed layer itself increases as the thickness of the seed layer increases. As a result, the crystallinity (orientation) of the plated film formed on the seed layer also increases, and accordingly, it is difficult to perform crystallization of the conductive films while establishing lattice matches with neighboring films at the annealing step. Thus, since the crystallinity (orientation) of the conductive film formed on the seed layer can be decreased by reducing the thickness of the seed layer, the crystal structure of the conductive film can be settled into the most stable structure by the heat process (preferably, a low temperature heat process) performed after the formation of the conductive film. As a result, abnormal growth of a crystal does not occur even when heat is applied to the conductive film, e.g., the plated film, at a subsequent step or during the operation of the semiconductor device. Therefore, formation of voids can be suppressed.

As described above, an objective of the present invention is to eliminate the high temperature process performed immediately after the formation of the conductive film by plating, or the like, and suppress formation of voids. To this end, according to the present invention, a thin seed layer is deposited on a barrier film having crystallinity. With such a feature, conductive films can be sufficiently crystallized even when the heat process immediately after the formation of the conductive films is performed at a low temperature.

Specifically, the thickness of the seed Cu layer formed on the barrier film having a crystallinity is set to be equal to or smaller than a ¼ of the total thickness of the plated Cu film and the seed Cu layer or set to be equal to or smaller than 120 nm. As a result, the plated Cu film is sufficiently crystallized by low-temperature annealing at 200° C. or lower which is performed immediately after plating. With such an arrangement, re-crystallization of the Cu film formed by integrating the plated Cu film and the seed Cu layer (transfer of Cu atoms), i.e., a change (shrinkage) in the volume of the Cu film is suppressed. Accordingly, formation of voids is suppressed.

(Embodiment)

Hereinafter, a production method of a semiconductor device according to an embodiment of the present invention is described with an example where a wiring material used is Cu, with which the effects of the present invention are most outstanding.

FIGS. 4A to 4C and FIGS. 5A to 5C are cross-sectional views which illustrate steps of a production method of a semiconductor device according to an embodiment of the present invention.

Figure 4A:
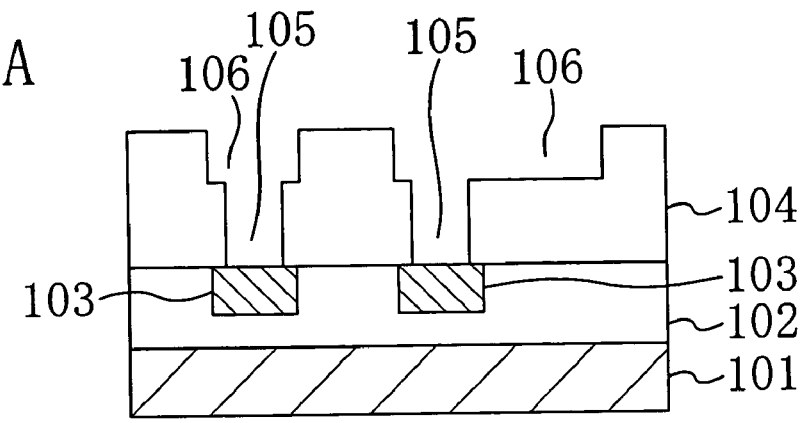
FIGS. 4A to 4C are cross-sectional views which illustrate the steps of a production method of a semiconductor device according to an embodiment of the present invention.

In the first place, as shown in FIG. 4A, a first insulating film 102 including first wires 103 made of copper buried therein is formed on a semiconductor substrate 101 having a semiconductor element (not shown) formed thereon. It should be noted that a barrier film of tantalum is formed between the first wires 103 and the first insulating film 102, although it is not shown. Then, a second insulating film 104 is formed on the first insulating film 102. Thereafter, in the second insulating film 104, holes 105 are formed so as to reach the first copper wires 103, and wire trenches 106 are formed so as to communicate with the holes 105.

Figure 4B:
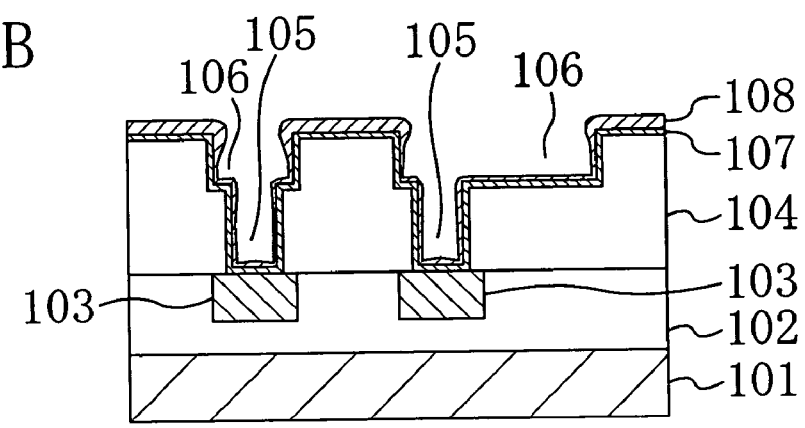

Next, as shown in FIG. 4B, a barrier film 107 having a crystal structure, e.g., a tantalum (Ta) film having a thickness of about 30 nm, is deposited by sputtering over the entire surface of the second insulating film 104 which includes the bottom and walls of the holes 105 and the wire trenches 106. Then, a seed layer 108, e.g., a copper (Cu) film having a thickness of about 100 nm, is non-epitaxially grown by sputtering on the barrier film 107.

Figure 4C:
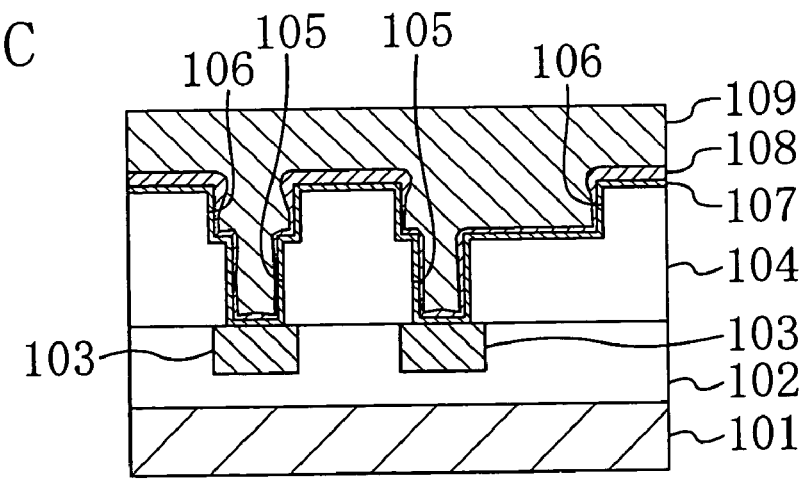
Figure 5A:
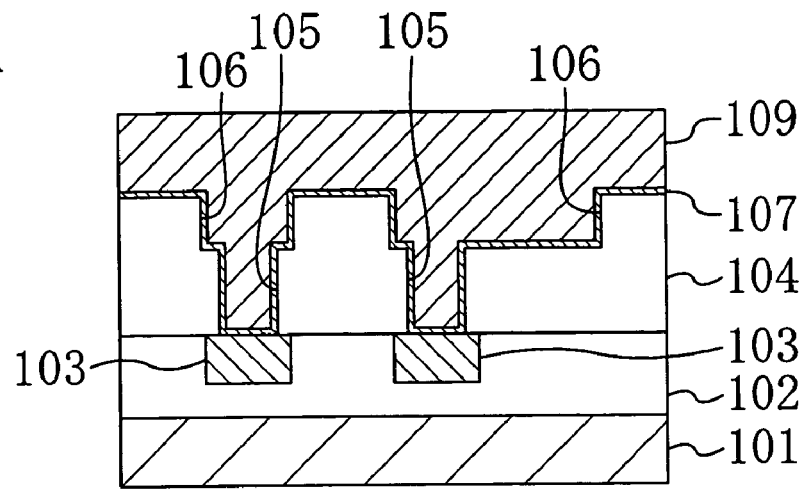
FIGS. 5A to 5C are cross-sectional views which illustrate the steps of a production method of a semiconductor device according to an embodiment of the present invention.

Next, as shown in FIG. 4C, a conductive film 109, e.g., a copper film having a thickness of about 600 nm, is deposited by, for example, an electrolytic plating method so as to completely fill the holes 105 and the wire trenches 106. Thereafter, for the purpose of stabilizing the seed layer 108 and the copper film 109, the seed layer 108 and the copper film 109 are annealed at a temperature equal to or higher than 100° C. and equal to or lower than 200° C., e.g., at 150° C., for about 120 minutes. As a result, as shown in FIG. 5A, the seed layer 108 and the copper film 109 are integrated (hereinafter, a resultant conductive film formed by integrating the seed layer 108 and the conductive film 109 is simply referred to as "conductive film 109").

Figure 5B:
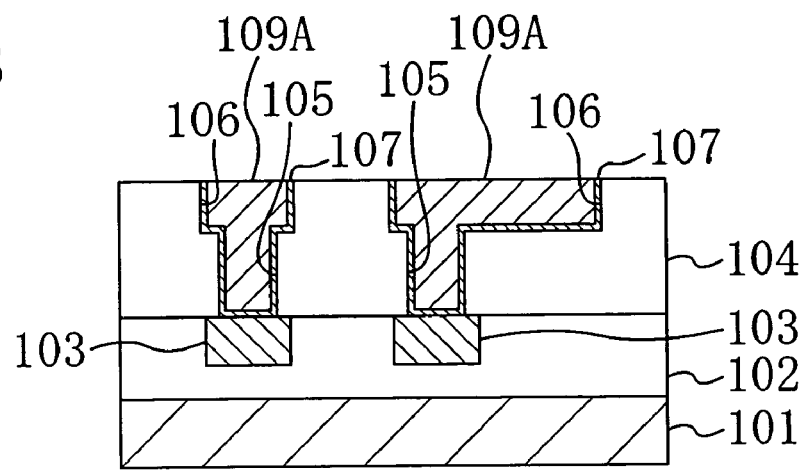

Next, parts of the conductive film 109 and barrier film 107 which extend out of the wire trenches 106 are removed using, for example, a CMP method. As a result, second wires 109A of copper are formed on the barrier film 107 in the holes 105 and the wire trenches 106 as shown in FIG. 5B.

Figure 5C:
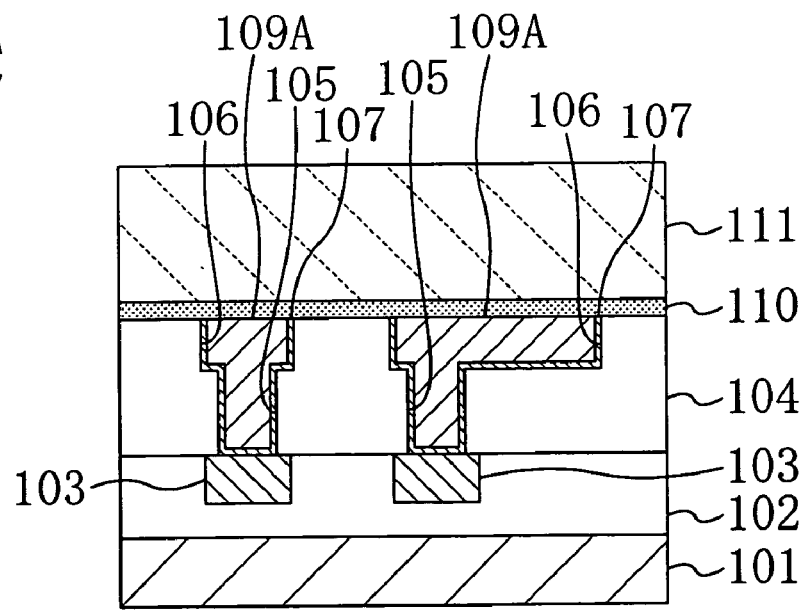
Figure 6A:
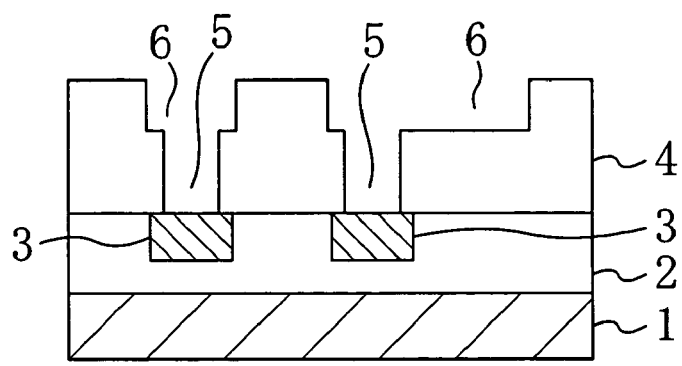
FIGS. 6A to 6D are cross-sectional views which illustrate the steps of a conventional production method of a semiconductor device.
Figure 6B:
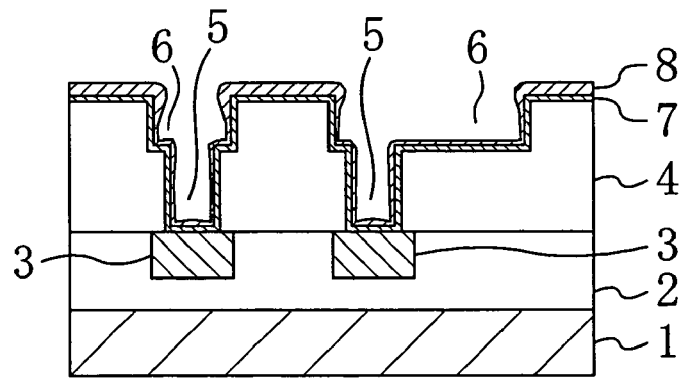
Figure 6C:
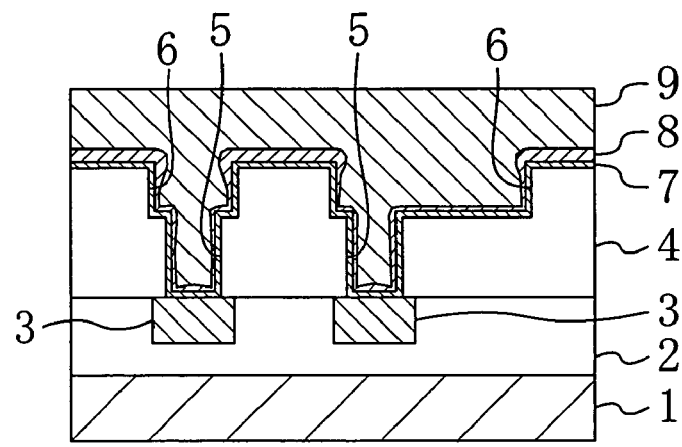
Figure 6D:
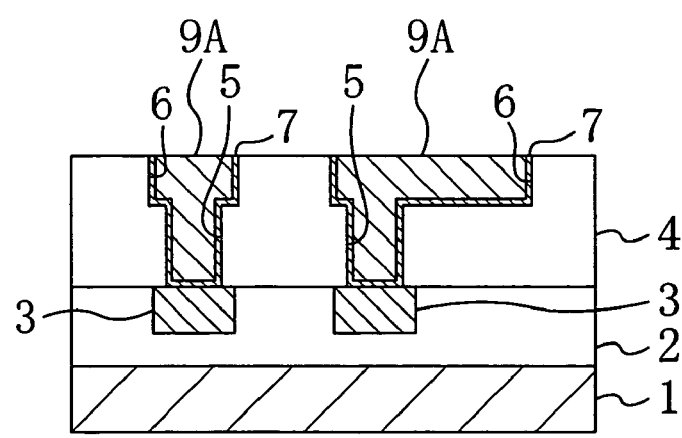
Figure 7:
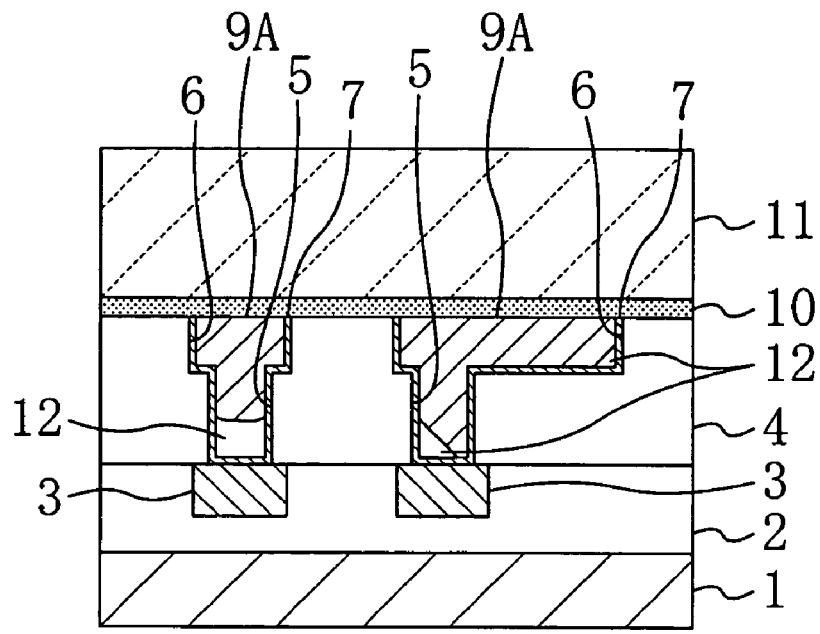
FIG. 7 illustrates problems in a conventional production method of a semiconductor device.
Figure 8:
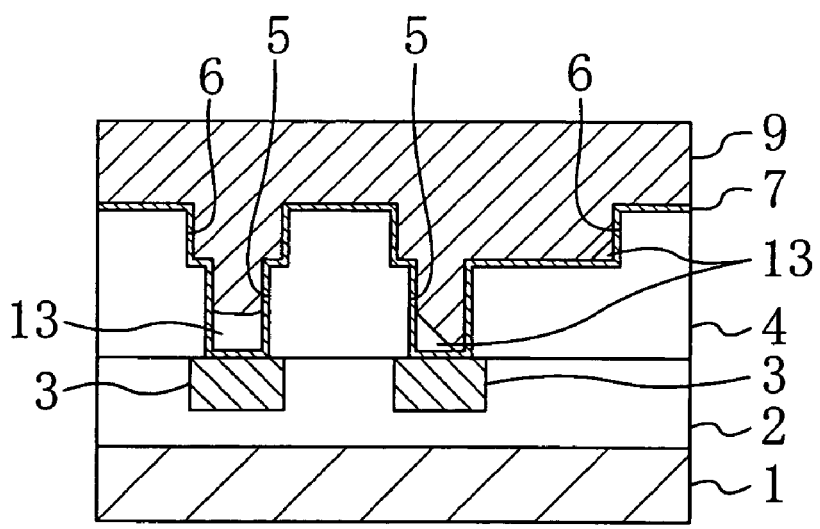
FIG. 8 illustrates problems in a conventional production method of a semiconductor device.

Next, as shown in FIG. 5C, a silicon nitride film 110 and a third insulating film 111 are sequentially formed over the upper surfaces of the second insulating film 104 and the second wires 109A.

According to the present invention, the seed layer 108 is non-epitaxially grown on the barrier film 107 having a crystallinity. Thus, in both the seed layer 108 and the conductive film 109 formed thereon, the energy state becomes higher as the grain size decreases. Therefore, the seed layer 108 and the conductive film 109 can readily be crystallized only with a small activation energy which does not cause formation of voids, i.e., at a low temperature. Furthermore, since the grain size of the seed layer 108 is small, crystallization of the seed layer 108 proceeds while establishing a lattice match with the crystal structure of the underlying barrier film 107. Accordingly, the adhesion between the barrier film 107 and the seed layer 108 is improved, and thus, both the seed layer 108 and the conductive film 109 are crystallized without forming a void.

Specifically, the thickness of the seed layer 108 formed on the barrier film 107 (e.g., 100 nm) is equal to or smaller than a ¼ of the total thickness of the seed layer 108 and the conductive film 109 formed thereon (e.g., 700 nm), or is equal to or smaller than 120 nm. Thus, the conductive film 109 can be sufficiently crystallized even when a heat process is performed at a low temperature (specifically, at a temperature equal to or higher than 100° C. and equal to or lower than 200° C.) for the purpose of stabilizing the conductive film 109. In other words, the conductive film 109 can be sufficiently crystallized at the heat process performed immediately after the formation of the conductive film 109 without using a high temperature which may cause formation of voids. Furthermore, even when heat is applied to the conductive film 109 (integrated with the seed layer 108) which constitutes a wiring at a subsequent step (e.g., at the step of depositing the silicon nitride film 110 or the third insulating film 111) or during the operation of the semiconductor device, re-crystallization of the conductive film 109 can be suppressed because the conductive film 109 has already been sufficiently crystallized. Thus, formation of voids in the conductive film 109 is prevented. That is, since occurrence of a defect due to stress migration is prevented, the wiring reliability is improved, and the production yield of the semiconductor device is increased.

Furthermore, according to the present embodiment, the heat process immediately after the formation of the conductive film 109 by an electrolytic plating method is performed at a low temperature of 150° C., and as a matter of course, a void is not formed in the conductive film 109 due to the heat process. Furthermore, a CMP step is performed after the annealing step in order to remove parts of the conductive film 109 and the barrier film 107 which extend out of the wire trenches 106, and therefore, a peeling of films at the interface between the barrier film 107 and the conductive film 109 is prevented. This is because planarization is performed by CMP after the seed layer 108 and the plated film (conductive film 109 before annealing) are crystallized in this order while establishing a lattice match with the crystallinity of the barrier film 107 such that these films are integrated.

It should be noted that, in consideration of surely achieving the above-described effects of the present invention, it is preferable that the ratio of the thickness of the seed layer 108 to the total thickness of the seed layer 108 and the conductive film 109 before annealing is equal to or higher than $\frac{1}{30}$ and equal to or lower than $\frac{1}{4}$, or that the thickness of the seed layer 108 is equal to or greater than 20 nm and equal to or smaller than 120 nm.

However, even when the thickness of the seed layer is equal to or smaller than a $\frac{1}{4}$ of the total thickness of the seed layer and the conductive film formed thereon, the following problem may occur in the case where the thickness of the conductive film is too large as compared with the thickness of the seed layer. That is, in this case, amorphousness of the thin seed layer does not extend into the thick conductive film, and thus, it is difficult to homogeneously crystallize the conductive film. In other words, even when the seed layer has relatively high amorphousness, the conductive film results in a film having an incomplete and inhomogeneous crystallinity. As a result, in order to sufficiently achieve homogeneous crystallization of the seed layer and the conductive film, annealing needs to be performed after the formation of the conductive film at a higher temperature as compared with a general annealing process. However, this causes the formation of voids in the conductive film.

Thus, in the present embodiment, it is preferable that the ratio of the thickness of the seed layer 108 to the total thickness of the seed layer 108 and the conductive film 109 is equal to or lower than $\frac{1}{4}$, and the thickness of the conductive film 109 formed on the seed layer 108 is in a predetermined range such that the entirety of the conductive film 109 can be homogeneously crystallized by low temperature annealing (specifically, heat process at a temperature equal to or higher than 100° C. and equal to or lower than 200° C.).

Furthermore, in the present embodiment, the step of depositing the seed layer 108 is preferably performed at a temperature which is equal to or higher than a $\frac{1}{10}$ of the absolute temperature of the melting point of the seed layer 108 and equal to or lower than a $\frac{1}{3}$ of the absolute temperature of the melting point of the seed layer 108. With such a setting, crystal growth is suppressed during the film formation, and thus, the seed layer 108 can be deposited so as to be in a more amorphous state. Examples of the method for depositing the seed layer 108 so as to be in an amorphous-like state include physical vapor deposition methods, chemical vapor deposition methods, electroless plating methods, etc. Especially when employing a chemical vapor deposition method, an amorphous-like seed layer can be formed even at a high temperature as compared with the other methods. Specifically, when depositing a conductive film by a chemical vapor deposition (CVD) method, atoms of impurities are trapped in the conductive film, and accordingly, crystal growth of the conductive film is suppressed. Thus, the progress of crystallization of the conductive film is restrained even at a relatively high temperature, and therefore, an amorphous-like conductive film can be formed even at a temperature higher than a $\frac{1}{4}$ of the absolute temperature of the melting point of the conductive film.

Furthermore, in the present embodiment, the step of heating the seed layer 108 and the conductive film 109 to integrate these layers 108 and 109 is preferably performed at a temperature which is equal to or higher than a $\frac{1}{5}$ of, and equal to or lower than a $\frac{1}{2}$ of, the absolute temperature of the melting point of the conductive film formed by integrating the seed layer 108 and the conductive film 109 (i.e., the conductive film 109 obtained after annealing). With such a setting, it is possible to modify the conductive film 109 so as to have a hard crystal structure even at a relatively low temperature because the conductive film 109 has already been crystallized to some extent at the time immediately after the steps of depositing the seed layer 108 and the conductive film 109. Moreover, in the conductive film 109 which already have a certain crystal structure, crystallization is performed relatively slowly at a low temperature, whereby crystallization of the film formed by integrating the seed layer 108 and the conductive film 109 can be completed with excellent adhesion to the neighboring films without deteriorating the lattice matches once established between the conductive film 109 and its neighboring layers.

Furthermore, in the present embodiment, the materials of the seed layer 108 and the conductive film 109 are not limited to any particular material. However, the seed layer 108 and the conductive film 109 are each preferably made of copper or a metal mainly containing copper. With such a material, a low-resistant copper wiring having a high electromigration (EM) resistance can be formed.

Furthermore, in the present embodiment, the material of the barrier film 107 is not limited to any particular material. The barrier film 107 may be, for example, a tantalum film, a tantalum alloy film, or the like. In the case where at least a surface portion of the barrier film 107 is formed of a β-structured tantalum film or a β-structured tantalum alloy film, the following effects can be obtained. In the case where the seed layer 108 and the conductive film 109 are each made of copper or an alloy mainly containing copper, the seed layer 108 and the conductive film 109 can readily be formed on the barrier film 107 because the crystal structures of β-structured tantalum and β-structured tantalum alloy are similar to that of copper.

Furthermore, in the present embodiment, the method for forming the seed layer 108 is not limited to any particular method. For example, the seed layer 108 may be formed using a physical vapor deposition method or a chemical vapor deposition method.

Furthermore, in the present embodiment, the method for forming the conductive film 109 is not limited to any particular method. For example, the conductive film 109 may be formed using a chemical vapor deposition method or a plating method. In the case where a hole or trench is filled with the conductive film 109, it is preferable that the conductive film 109 is formed using an electrolytic plating method. With such an arrangement, the hole or trench is surely filled with the conductive film 109.

The applications of the present invention are not limited to the above-described embodiment. It should be noted, however, that when the present invention is applied to the formation of buried copper wires as illustrated in the above embodiment, the above-described effects of the present invention are most outstanding.

What is claimed is:

1. A method for producing a semiconductor device, comprising the steps of:

forming a first conductive film as a seed layer having non epitaxial crystal structure on a barrier film having a crystal structure;

forming a second conductive film which is made of the same material as the first conductive film on the first conductive film; and heating the first conductive film and the second conductive film such that the first and second conductive films are integrated to form a third conductive film.

2. The method of claim 1, wherein each of the first conductive film and the second conductive film is formed of copper or a metal mainly containing copper.

3. The method of claim 1, wherein the resistivity of the third conductive film is equal to or smaller than 1.9 $\mu\Omega$·cm.

4. The method of claim 1, wherein the resistivity of a layered film including the first conductive film and the second conductive film before the integration of the first and second conductive films is equal to or greater than 2.2 $\mu\Omega$·cm.

5. The method of claim 1, wherein the step of forming the first conductive film is performed at a temperature which is equal to or lower than a ⅓ of the absolute temperature of the melting point of the first conductive film.

6. The method of claim 1, wherein the step of heating the first conductive film and the second conductive film is performed at a temperature which is equal to or lower than a ½ of the absolute temperature of the melting point of the third conductive film.

7. The method of claim 1, wherein the barrier film is a tantalum film or tantalum alloy film.

8. The method of claim 7, wherein the crystal structure of the tantalum film or tantalum alloy film is a β-structure.

9. The method of claim 1, wherein the step of forming the first conductive film includes the step of forming the first conductive film by a physical vapor deposition method or a chemical vapor deposition method.

10. The method of claim 1, wherein the step of forming the second conductive film includes the step of forming the second conductive film by a chemical vapor deposition method or a plating method.

11. The method of claim 1, wherein the step of heating the first conductive film and the second conductive film is performed at a temperature equal to or lower than 200° C.

12. The method of claim 1, wherein:
the barrier film is formed on a wall of a concaved portion provided in an insulating film;
the step of forming the first conductive film includes the step of forming the first conductive film on the barrier film in the concaved portion such that the concaved portion is filled to an intermediate depth thereof;
the step of forming the second conductive film includes the step of forming the second conductive film on the first conductive film in the concaved portion such that the concaved portion is completely filled; and
the method further includes, after the step of heating the first conductive film and the second conductive film such that the first and second conductive films are integrated to form a third conductive film, the step of removing a portion of the third conductive film which extends out of the concaved portion, thereby forming a wire in the concaved portion.

13. A method for producing a semiconductor device, comprising the steps of:
forming a first conductive film as a seed layer having non epitaxial crystal structure on a barrier film having a crystal structure;
forming a second conductive film which is made of the same material as the first conductive film on the first conductive film; and
heating the first conductive film and the second conductive film such that the first and second conductive films are integrated to form a third conductive film,
wherein the thickness of the first conductive film is set to be equal to or smaller than a ¼ of the total thickness of the first conductive film and the second conductive film.

14. The method of claim 13, wherein the resistivity of a layered film including the first conductive film and the second conductive film before the integration of the first and second conductive films is equal to or greater than 2.2 $\mu\Omega$·cm.

15. The method of claim 13, wherein the step of forming the first conductive film is performed at a temperature which is equal to or lower than a ⅓ of the absolute temperature of the melting point of the first conductive film.

16. The method of claim 13, wherein:
the barrier film is formed on a wall of a concaved portion provided in an insulating film;
the step of forming the first conductive film includes the step of forming the first conductive film on the barrier film in the concaved portion such that the concaved portion is filled to an intermediate depth thereof;
the step of forming the second conductive film includes the step of forming the second conductive film on the first conductive film in the concaved portion such that the concaved portion is completely filled; and
the method further includes, after the step of heating the first conductive film and the second conductive film such that the first and second conductive films are integrated to form a third conductive film, the step of removing a portion of the third conductive film which extends out of the concaved portion, thereby forming a wire in the concaved portion.

17. A method for producing a semiconductor device, comprising the steps of:
forming a first conductive film as a seed layer having non epitaxial crystal structure on a barrier film having a crystal structure;
forming a second conductive film which is made of the same material as the first conductive film on the first conductive film; and
heating the first conductive film and the second conductive film such that the first and second conductive films are integrated to form a third conductive film,
wherein the thickness of the first conductive film is set to be equal to or smaller than 120 nm.

18. The method of claim 17, wherein the resistivity of a layered film including the first conductive film and the second conductive film before the integration of the first and second conductive films is equal to or greater than 2.2 $\mu\Omega$·cm.

19. The method of claim 17, wherein the step of forming the first conductive film is performed at a temperature which is equal to or lower than a ⅓ of the absolute temperature of the melting point of the first conductive film.

20. The method of claim 17, wherein:
the barrier film is formed on a wall of a concaved portion provided in an insulating film;
the step of forming the first conductive film includes the step of forming the first conductive film on the barrier film in the concaved portion such that the concaved portion is filled to an intermediate depth thereof;
the step of forming the second conductive film includes the step of forming the second conductive film on the first conductive film in the concaved portion such that the concaved portion is completely filled; and
the method further includes, after the step of heating the first conductive film and the second conductive film such that the first and second conductive films are integrated to form a third conductive film, the step of removing a portion of the third conductive film which extends out of the concaved portion, thereby forming a wire in the concaved portion.

21. The method of claim 1, wherein the first conductive film has an amorphous structure.

22. The method of claim 13, wherein the first conductive film has an amorphous structure.

23. The method of claim 17, wherein the first conductive film has an amorphous structure.

24. A method for producing a semiconductor device, comprising the steps of:
   forming a first conductive film as a seed layer having a relatively amorphous structure on a barrier film having a crystal structure;
   forming a second conductive film which is made of the same material as the first conductive film on the first conductive film; and
   heating the first conductive film and the second conductive film such that the first and second conductive films are integrated to form a third conductive film.

25. The method of claim 24, wherein each of the first conductive film and the second conductive film is formed of copper or a metal mainly containing copper.

26. The method of claim 24, wherein the resistivity of the third conductive film is equal to or smaller than 1.9 $\mu\Omega\cdot$cm.

27. The method of claim 24, wherein the resistivity of a layered film including the first conductive film and the second conductive film before the integration of the first and second conductive films is equal to or greater than 2.2 $\mu\Omega\cdot$cm.

28. The method of claim 24, wherein the step of forming the first conductive film is performed at a temperature which is equal to or lower than a ⅓ of the absolute temperature of the melting point of the first conductive film.

29. The method of claim 24, wherein the step of heating the first conductive film and the second conductive film is performed at a temperature which is equal to or lower than a ½ of the absolute temperature of the melting point of the third conductive film.

30. The method of claim 24, wherein the barrier film is a tantalum film or tantalum alloy film.

31. The method of claim 30, wherein the crystal structure of the tantalum film or tantalum alloy film is a β-structure.

32. The method of claim 24, wherein the step of forming the first conductive film includes the step of forming the first conductive film by a physical vapor deposition method or a chemical vapor deposition method.

33. The method of claim 24, wherein the step of forming the second conductive film includes the step of forming the second conductive film by a chemical vapor deposition method or a plating method.

34. The method of claim 24, wherein the step of heating the first conductive film and the second conductive film is performed at a temperature equal to or lower than 200° C.

35. The method of claim 24, wherein:
   the barrier film is formed on a wall of a concaved portion provided in an insulating film;
   the step of forming the first conductive film includes the step of forming the first conductive film on the barrier film in the concaved portion such that the concaved portion is filled to an intermediate depth thereof;
   the step of forming the second conductive film includes the step of forming the second conductive film on the first conductive film in the concaved portion such that the concaved portion is completely filled; and
   the method further includes, after the step of heating the first conductive film and the second conductive film such that the first and second conductive films are integrated to form a third conductive film, the step of removing a portion of the third conductive film which extends out of the concaved portion, thereby forming a wire in the concaved portion.

* * * * *